US010205037B2

(12) United States Patent
Yamashita et al.

(10) Patent No.: US 10,205,037 B2
(45) Date of Patent: Feb. 12, 2019

(54) PHOTODIODE DEVICE AND MANUFACTURING METHOD THEREOF

(71) Applicant: TAIWAN SEMICONDUCTOR MANUFACTURING COMPANY LTD., Hsinchu (TW)

(72) Inventors: Yuichiro Yamashita, Hsinchu (TW); Hsueh-Liang Chou, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 15 days.

(21) Appl. No.: 15/618,748

(22) Filed: Jun. 9, 2017

(65) Prior Publication Data

US 2018/0358488 A1    Dec. 13, 2018

(51) Int. Cl.
*H01L 27/146* (2006.01)
*H01L 31/0236* (2006.01)
(Continued)

(52) U.S. Cl.
CPC .... *H01L 31/02363* (2013.01); *H01L 27/1461* (2013.01); *H01L 27/14625* (2013.01); *H01L 31/035272* (2013.01); *H01L 31/1804* (2013.01); *H01L 31/02027* (2013.01); *H01L 31/107* (2013.01)

(58) Field of Classification Search
CPC .. H01L 31/00–31/208; H01L 31/03529; H01L 27/14609–27/14616; H01L 27/14689; H01L 27/146–27/14893
See application file for complete search history.

(56) References Cited

U.S. PATENT DOCUMENTS 5,120,664 A * 6/1992 Murotani .......... H01L 27/14649
257/E27.136
5,285,098 A * 2/1994 Borrello ............ H01L 27/14649
257/436

(Continued)

OTHER PUBLICATIONS

H. Sai et al., "Photocurrent enhancement in thin-film silicon solar cells by combination of anti-reflective sub-wavelength structures and light-trapping textures," Progress in Photovoltaics: Research and Applications, published online in Wiley Online Library (wileyonlinelibrary.com). Feb. 2015. DOI: 10.1002/pip.2594, 2015.

(Continued)

*Primary Examiner* — Eric A. Ward
(74) *Attorney, Agent, or Firm* — WPAT, P.C. Intellectual Property Attorneys; Anthony King

(57) ABSTRACT

The present disclosure provides a photodiode device, which includes a semiconductor substrate, a well region in the semiconductor substrate of a first dopant type, a first doped region of the first dopant type in the well region, and a second doped region of a second dopant type disposed in the well region and over the first doped region. The second doped region comprises first recesses exposed through a surface of the second doped region, and a first portion of the second doped region on the surface comprises a first doping concentration of the second dopant type greater than a second doping concentration of a second portion of the second doped region away from the first recesses.

20 Claims, 21 Drawing Sheets

(51) Int. Cl.
*H01L 31/18* (2006.01)
*H01L 31/0352* (2006.01)
*H01L 31/02* (2006.01)
*H01L 31/107* (2006.01)

(56) References Cited

U.S. PATENT DOCUMENTS

| | | | | |
|---|---|---|---|---|
| 6,278,145 B1* | 8/2001 | Kato | ................ | H01L 27/14609 |
| | | | | 257/292 |
| 7,456,452 B2* | 11/2008 | Wells | ................ | H01L 27/14601 |
| | | | | 257/292 |
| 7,880,255 B2* | 2/2011 | Baggenstoss | ..... | H01L 27/14601 |
| | | | | 257/436 |
| 8,217,436 B2* | 7/2012 | Henderson | ............ | H01L 31/107 |
| | | | | 257/292 |
| 9,899,436 B1* | 2/2018 | Lee | .................... | H01L 27/1461 |
| 2008/0048283 A1* | 2/2008 | Han | ................ | H01L 27/14609 |
| | | | | 257/432 |
| 2013/0193546 A1* | 8/2013 | Webster | .............. | H01L 27/1443 |
| | | | | 257/438 |
| 2015/0155314 A1* | 6/2015 | Takagi | ................ | H01L 27/1462 |
| | | | | 257/443 |
| 2016/0197118 A1* | 7/2016 | Park | .................. | H01L 27/14612 |
| | | | | 257/225 |
| 2017/0358694 A1* | 12/2017 | Juntunen | .......... | H01L 31/02161 |

OTHER PUBLICATIONS

"Single-photon avalanche diode—Wikipedia", https://en.wikipedia.org/w/index.php?title=Single-photon_avalanche_diode&oldid=618255943, a Jul. 24, 2014 version.

* cited by examiner

PHOTODIODE DEVICE AND MANUFACTURING METHOD THEREOF

BACKGR BIND

Photodiodes are used in converting received photons into electrical currents. The performance of a photodiode is usually assessed in terms of several parameters, such as the quantum efficiency, operational wavelength, sensitivity, etc. Specifically, the sensitivity of a photodiode may be reduced by unwanted current (i.e., dark current) in the photodiodes that occurs even when no photons are entering the photodiode. As a result, the detection accuracy is adversely impacted. When photodiodes are used in an image sensor, excessive dark current may lead to image degradation and poor device performance. Therefore, it is desirable to improve the performance of a photodiode by enhancing the current generation efficiency while minimizing the amount of dark current.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. Specifically, the dimensions of the various features may be arbitrarily increased or reduced for clarity of discussion.

DETAILED DESCRIPTION

Figure 1A:
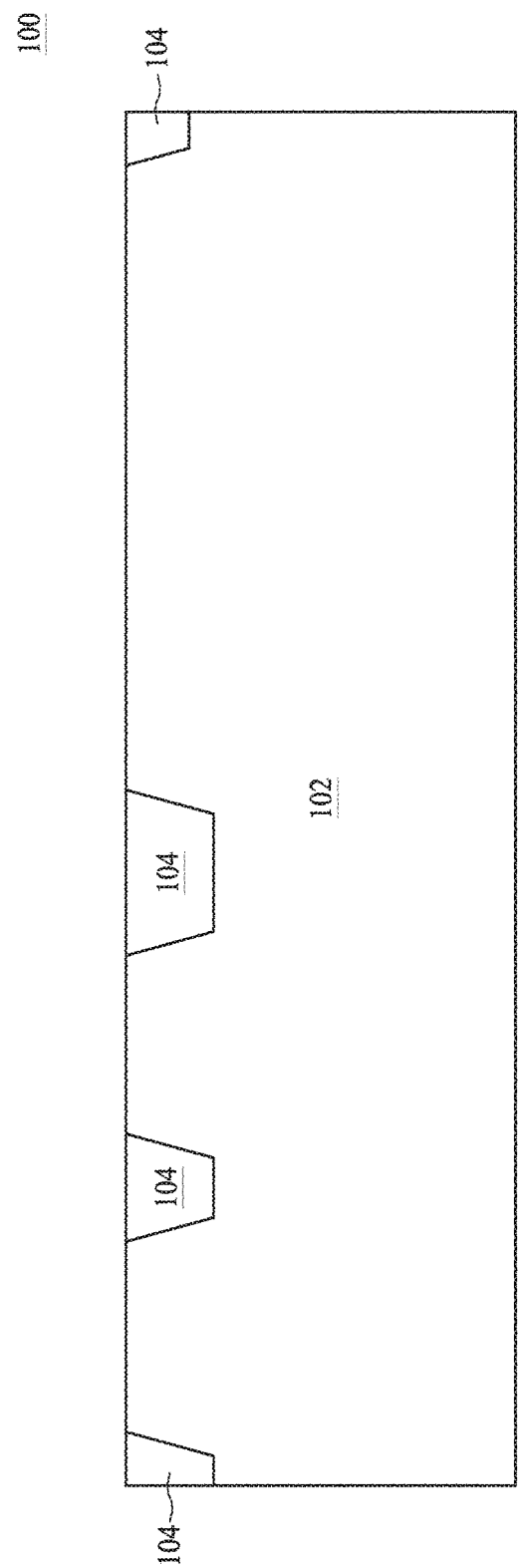
FIGS. 1A through 1I are cross-sectional views of intermediate structures of a method of manufacturing a photodiode device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides structures and manufacturing operations of a photodiode device according to various embodiments. In the present disclosure a photodiode device structure with an anti-reflection structure is proposed to enhance the efficiency of photon reception, in addition, a doping profile of the photodiode device is arranged to mitigate dark current and reduce occurrences of peak electric field values for the junction in the photodiode device. Both the sensitivity of the photodiode device and the photon reception efficiency can be improved effectively.

FIGS. 1A through 1I are cross-sectional views of intermediate structures of a method of manufacturing a photodiode device 100, in accordance with some embodiments. Referring to FIG. 1A, a substrate 102 is provided or received. The substrate 102 includes a semiconductor material such as silicon. In some embodiments, the substrate 102 may include other semiconductor materials, such as silicon germanium, silicon carbide, gallium arsenide, or the like. Alternatively, the substrate 102 includes another elementary semiconductor, such as germanium; a compound semiconductor including gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In yet another embodiment, the substrate 102 is a semiconductor-on-insulator (SOI). In other alternatives, the substrate 102 may include a doped epitaxial layer, a gradient semiconductor layer, and/or a semiconductor layer overlaying another semiconductor layer of a different type, such as a silicon layer on a silicon germanium layer. The substrate 102 may be doped with an n-type dopant, such as arsenic, phosphor, or the like, or may be doped with a p-type dopant, such as boron or the like.

Next, isolation structures 104 are formed on the substrate 102. The isolation structures 104 may be shallow trench isolation (STI) or local oxidation of silicon (LOCOS). As an exemplary operation for manufacturing the isolation structures 104, several trenches are formed initially by an etching operation, such as a dry etching, a wet etching, a reactive ion etching (RIE) operation, or the like. Next, isolation materials are filled in the trenches to form the isolation structures 104. The isolation materials may be formed of electrically insulating materials, such as dielectric materials. In some embodiments, the isolation structures 104 are formed of an oxide (e.g., silicon oxide or Ge oxide), a nitride (e.g., silicon nitride), an oxynitride (e.g., GaP oxynitride), silicon dioxide ($SiO_2$), a nitrogen-bearing oxide (e.g., nitrogen-hearing $SiO_2$), a nitrogen-doped oxide (e.g., $N_2$-implanted $SiO_2$), silicon oxynitride (SixOyNz), a polymer material, or the like. The dielectric material may be formed using a suitable process such as atomic layer deposition (ALD), chemical vapor deposition (CVD), physical vapor deposition (PVD), thermal oxidation, UV-ozone oxidation, or combinations thereof. In some embodiments, a planarization operation, such as grinding or chemical mechanical planarization (CMP) processes, may be used to remove excess materials of the isolation structure 104 and level the top surfaces of the isolation structures 104 with the substrate 102.

Figure 1B:
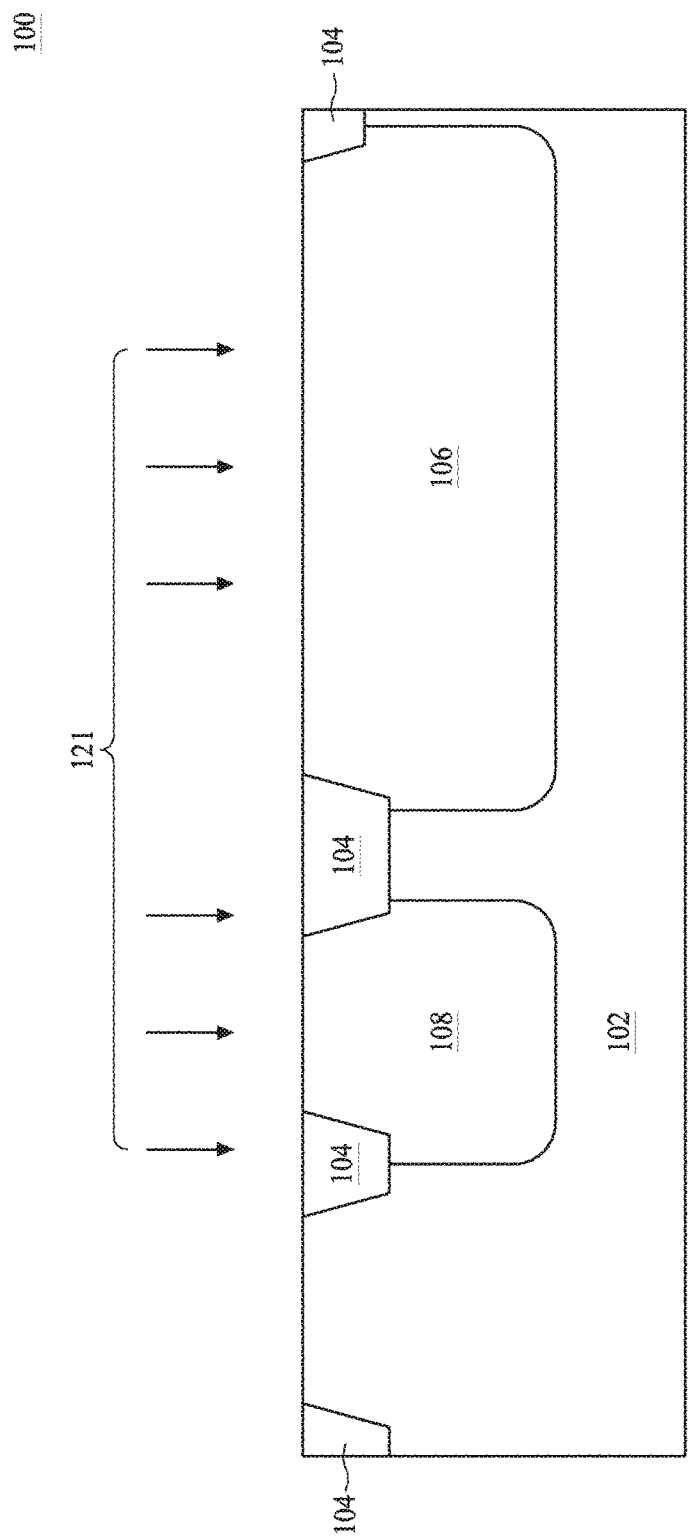

Referring to FIG. 1B, well regions 106 and 108 are formed in the substrate 102. The well regions 106 and 108 may be formed by implanting dopants by an ion implantation operation 121. Ions or dopants are implanted to desired portions of a front surface of the substrate 102. In some embodiments, a mask may be used to permit only the desired portions to receive dopants. In the present embodiments, each of well regions 106 and 108 are adjacent to the isolation structures 104. In some embodiments, the well regions 106 and 108 are surrounded by the isolation structures 104. In the present embodiments, adjacent well regions 106 and 108 are separated by at least one isolation structure 104. The well regions 106 and 108 may include n-type dopants, such as phosphorus or the like, or p-type dopants, such as boron or the like. In some embodiments, the dopant type of the well regions 206 is the opposite of the dopant type of the substrate 102. For example, the substrate 102 may be an n-type substrate while the well region 106 or 108 may be p-type wells. In some embodiments, the well region 106 or 108 has a doping concentration greater than a doping concentration of the substrate 102. In some embodiments, an annealing is performed to further diffuse the implanted dopants. As a result, dopants typically implanted in an upper portion of the substrate 102 are driven down to a deeper position. In some embodiments, the well regions 106 and 108 have a doping concentration of between about 5E14 atoms/cm$^3$ and about 1E16 atoms/cm$^3$. In some embodiments, the well regions 106 and 108 have a doping concentration of between about 1E15 atoms/cm$^3$ and about 5E15 atoms/cm$^3$.

Figure 1C:
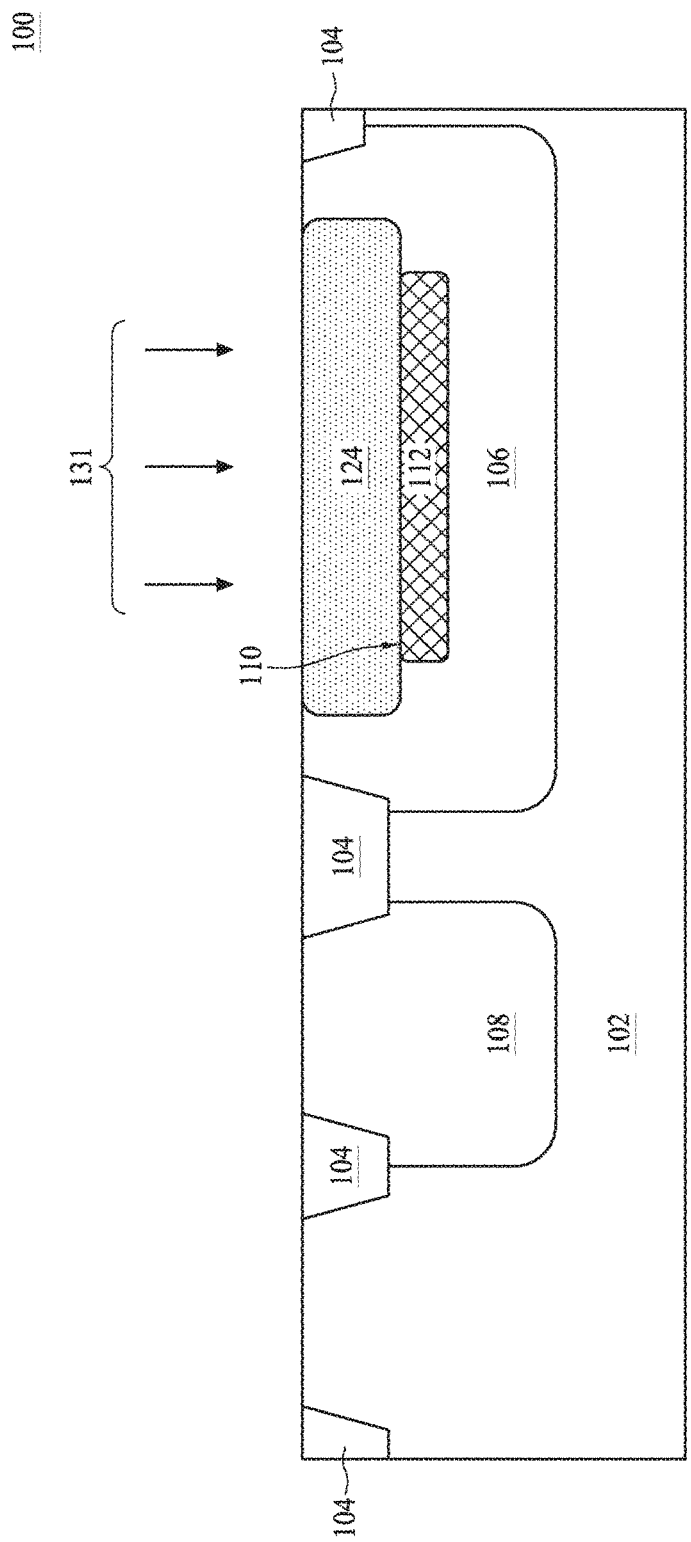
Figure 1D:
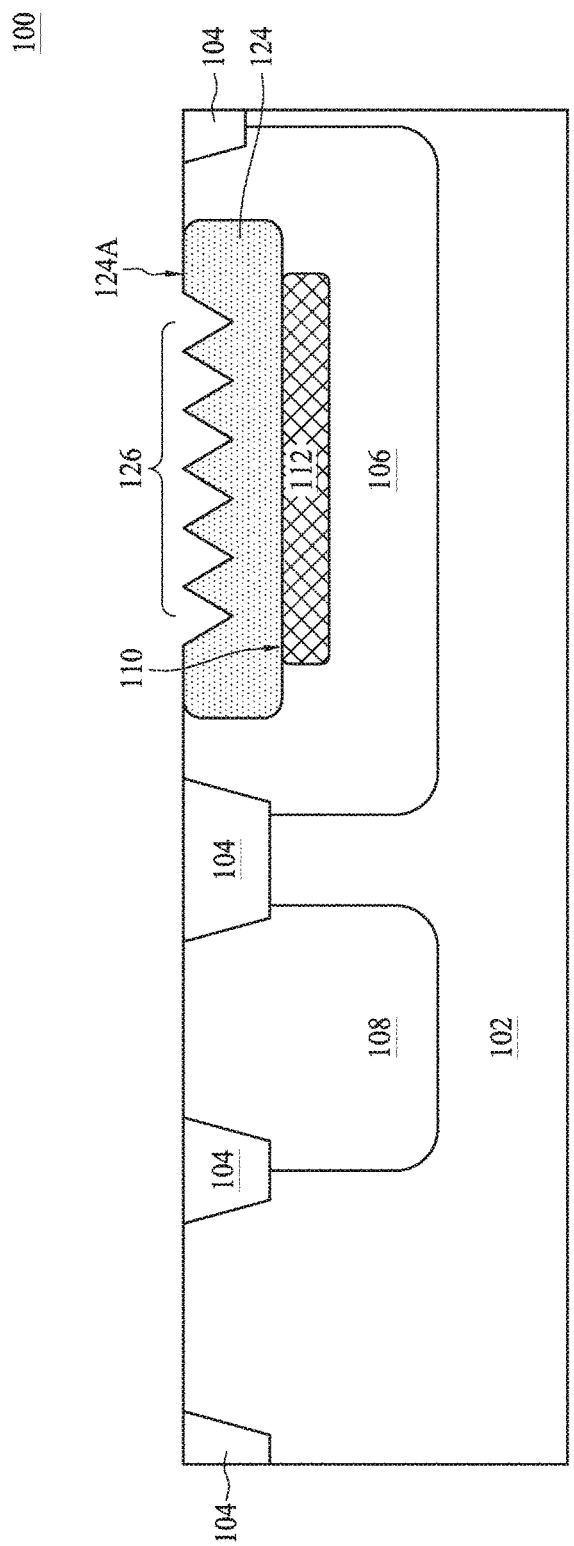
Figure 1E:
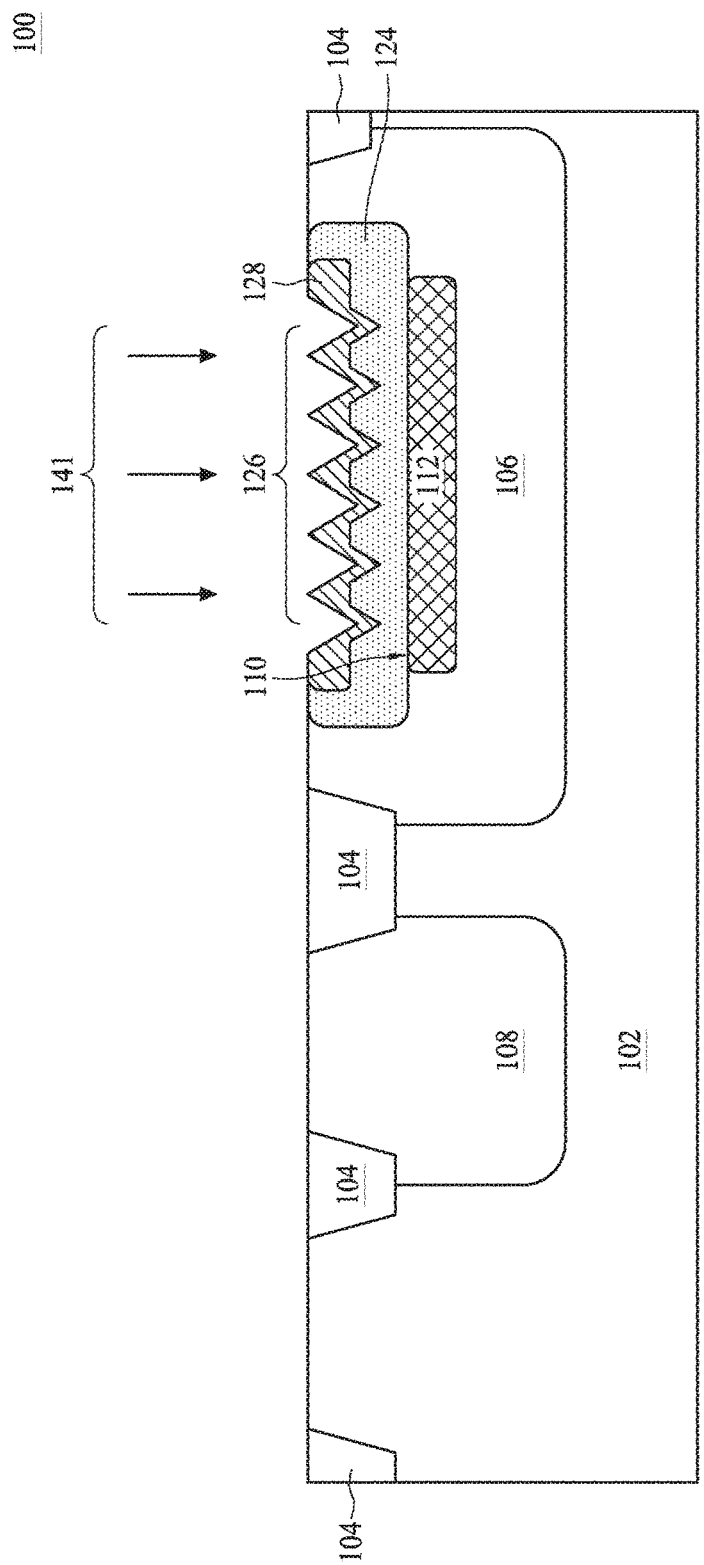

Referring to FIG. 1C, a first doped region 112 and a second doped region 124 are formed in the well region 106 by one or more implantation operations 131. In some embodiments, the first doped region 112 and the second doped region 124 are of opposite dopant types. For example, the first doped region 112 is of p-type and the second doped region 124 is of n-type. In some embodiments, the formation of the first doped region 112 may be followed by the formation of the second doped region 124. A PN junction 110 is established at the interface of the first doped region 112 and the second doped region 124. In some embodiments, the second doped region 124 covers the first doped region 112. In some embodiments, the second doped region 124 has a width greater than a width of the first doped region 112. In some embodiments, a portion of the well region 106 is exposed through the second doped region 124 and isolation structures 104.

In some embodiments, the first doped region is of a same dopant type as the well region 106. In some embodiments, the first doped region 112 has a doping concentration greater than a doping concentration of the well region 106. In some embodiments, the first doped region 112 has a doping concentration of between about 1E15 atoms/cm$^3$ and about 1E19 atoms/cm$^3$. In some embodiments, the first doped region 112 has a doping concentration of between about 5E15 atoms/cm$^3$ and about 1E18 atoms/cm$^3$. In some embodiments, the first doped region 112 has a doping concentration of between about 1E16 atoms/cm$^3$ and about 1E17 atoms/cm$^3$. In some embodiments, the second doped region 124 has a doping concentration of between about 5E16 atoms/cm$^3$ and about 5E19 atoms/cm$^3$. In some embodiments, the second doped region 124 has a doping concentration of between about 1E17 atoms/cm$^3$ and about 1E19 atoms/cm$^3$. In some embodiments, the second doped region 124 has a doping concentration of between about 5E17 atoms/cm and about 1E18 atoms/cm$^3$.

In FIG. ID, an upper surface 124A of the second doped region 124 is treated to form an anti-reflection structure 126. The anti-reflection structure 126 is configured to assist in reducing the amount of reflected photons and increase the photon reception efficiency of the photodiode device 100. The anti-reflection structure 126 may be formed by a surface texturing operation. The surface texturing operation may generate textures with repeated units of protrusions or cavities, and the units abut with one another or are arranged in an array or grid of units. In the present embodiment, the anti-reflection structure 126 has a zig-zag sidewall from a cross-sectional view which is formed of triangular units, where the units may be triangular prisms, triangular pyramids, or the like. In some embodiments, each unit of the anti-reflection structure 126 has a sidewall meeting with a sidewall of another unit. In some embodiments, the textures of the anti-reflection structure 126 may be of different types, such as grooves, recesses, trenches, corrugations, humps, moth-eyes, honeycombs, or the like. In some embodiments, the anti-reflection structure 126 has a zig-zag shape from a cross-sectional view. In some embodiments, the anti-reflection structure 126 is formed of units with elongated ends that cross each other.

The width of each of the units of the anti-reflection structure 126 may be between about 1 μm and about 5 μm. In some embodiments, the geometry of the unit may be dependent upon the wavelength of the incident light. In some embodiments, each unit may be formed in a sub-wavelength scale. For example, when a wavelength of the incident light of interest is around 500 to 1000 nm, the size of the pyramid may be less than 500 nm. In some embodiments, the optical characteristics of the second doped region 124, such as reflectivity and refractivity, may be tuned during the surface texturing operation.

Referring to FIG. IF, a portion of the second doped region 124 receives a further ion implantation operation 141. A third doped region 128 is formed accordingly. In some embodiments, the third doped region 128 is of a same dopant type as the second doped region 124, such as n-type, and may be regarded as a portion of the second doped region 124. In some embodiments, the third doped region 128 may be formed with a mask layer not separately shown) delineating the doping areas as desired. In some embodiments, the third doped region 128 extends toward the boundary of the second doped region 124. In some embodiments, the third doped region 128 laterally surrounds the anti-reflection structure 126. After the ion implantation operation 141 is performed, an annealing operation may be performed to drive the ions to diffuse more deeply near the bottom of the anti-reflection structure 126. In some embodiments, the third doped region 128 has a doping concentration of between about 1E19 atoms/cm$^3$ and about 5E20 atoms/cm$^3$. In some embodiments, the third doped region 128 has a doping concentration of between about 1E19 atoms/cm$^3$ and about 2E20 atoms/cm$^3$. In some embodiments, the third doped region 128 has a doping concentration of between about 5E19 atoms/cm$^3$ and about 5E20 atoms/cm$^3$. In some embodiments, the third doped region 128 has a doping concentration of between about 5E19 and about 2E20 atoms/cm$^3$.

In operation, the well region 106 and the second doped region 124 are electrically coupled to an anode and a cathode, respectively. When the photodiode device 100 is biased with an appropriate voltage via the anode and the cathode, incident photons will trigger the generation of free electron-hole pairs and a sensing current is generated, in applications such as a single-photon diode or an avalanche photodiode, a strong electric field resulting from a high biased voltage can cause a great deal of free electron-hole pairs to flow through the depletion region even though only a small amount of photons are received. However, a photodiode would function well given a uniform depletion region and the resulting uniform electric field. As the bias increases, the depletion region is enlarged accordingly. When the anti-reflection structure 126 is incorporated into the photodiode device 100, the depletion region may extend towards, or even contact, the sidewalls of the anti-reflection structure 126. The resultant electric field may not be kept as uniform as possible under a limited size of the second doped region 124. Consequently, the dark current effect or the dark count rate (the average rate of registered counts of photons in the absence of incident light) increases. Accordingly, the photodiode sensitivity is negatively affected.

In the present embodiment, the third doped region 128, which has a higher doping concentration than the second doped region 124, can help reduce the size of the depletion region around the PN junction 110 given a consistent electric field. In some cases, the third doped region 128 may assist in reshaping the electric field distribution around the PN junction 110. Therefore, the resultant depletion region may not touch the anti-reflection structure 126. In addition, the electrons generated adjacent to sidewalls of the anti-reflection structure 126 will drain to the cathode more effectively. Moreover, free holes generated adjacent to sidewalls of the anti-reflection structure 126 will mostly be combined with majority charges, i.e., electrons, in the second doped region 124. As a result, the amount of undesired dark current is significantly reduced. For applications such as a single-photon diode or an avalanche photodiode, the dark count rate is also significantly reduced. The sensitivity of the photodiode device 100 is thus improved.

In some embodiments, the sidewalls of the anti-reflection structure 126 are surrounded by the third doped region 128 at a top portion. In the present embodiment, the third doped region 128 extends downward to the bottom of the anti-reflection structure 126. Accordingly, the sidewalls of the anti-reflection structure 126 are entirely surrounded by the third doped region 128. The photon-current generation of the photodiode device 100 is thus enhanced. In some embodiments, the third doped region 128 has a doping profile conformal to the shape of the anti-reflection structure 126 around a bottom portion. In some embodiments, a bottom of the third doped region 128 has a zig-zag doping profile. Furthermore, the junction resistance and contact resistance of the photodiode device 100 can be also reduced by the third doped region 128. The above-mentioned advantages allow the photodiode device 100 to function effectively in high-speed applications.

Figure 1F:
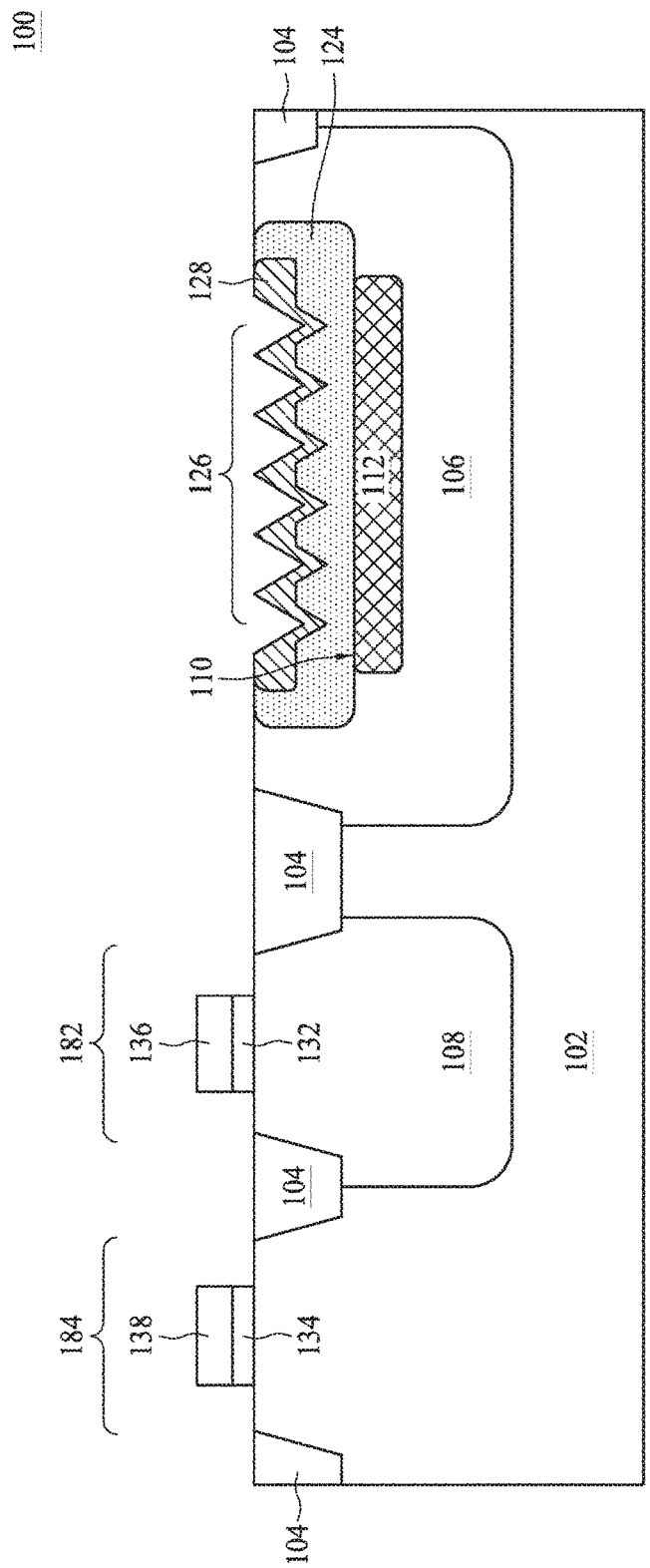
Figure 1G:
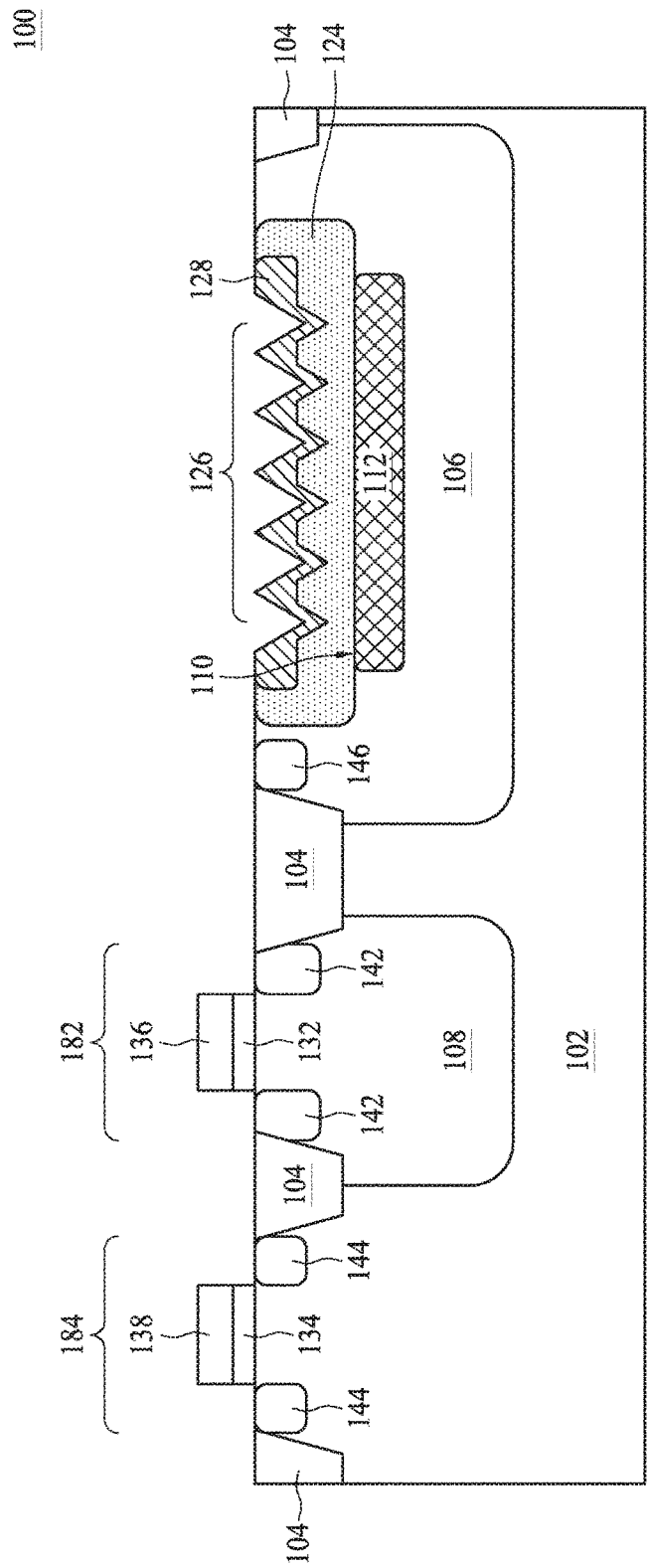

FIGS. 1F and 1G illustrate a forming of transistors of the photodiode device 100. In the present embodiment, two transistors are to be formed. However, any number of transistors or other active/passive devices are within the contemplated scope of the present disclosure. Initially, as shown in FIG. 1F, dielectric layers 132 and 134 are formed for a p-type transistor 182 and an n-type transistor 184, respectively, on the substrate 102. The dielectric layers 132 and 134 may be gate dielectric layers and formed of dielectric materials, such as silicon oxide or silicon nitride, silicon oxynitride, high-k dielectric material, other suitable materials, or combinations thereof. The high-k material may be selected from metal oxides, metal nitrides, metal silicates, transition metal-oxides, transition metal-nitrides, transitional metal-silicates, oxynitride of metals, metal aluminates, zirconium silicate, zirconium aluminate, hafnium oxide, or combinations thereof. Examples of high-k dielectric materials include $HfO_2$, HfSiO, HfSiON, HfZrO, LaO, BazrO, HfLaO, HfSiO, LaSiO, AlSiO, HfTaO, HfTiO, zirconium oxide, aluminum oxide, other suitable high-k dielectric materials, and combinations thereof.

Next, gate electrodes 136 and 138 are formed over the respective gate dielectric layers 132 and 134. The gate electrodes 136 and 138 may comprise conductive materials, such as polysilicon or metallic materials. In some embodiments, the conductive material may include a refractory metal or its compounds, e.g., tungsten (W), titanium nitride (TiN) or tantalum (Ta). Other commonly used metals that could be used in the conductive material include nickel (Ni) and gold (Au).

The dielectric layer 132 or 134 may formed by any suitable method, such as CVD, PVD, thermal evaporation PVD, electron beam PVD (EBPVD), reactive PVD, atomic layer deposition (ALD), plasma-enhanced CVD (PECVD), high-density plasma CVD (HDPCVD), low-pressure CVD (LPCVD), or the like. Furthermore, the gate electrodes 136 and 138 may be formed by an operation such as CVD, PVD, sputtering, or the like. In some embodiments, a patterning operation may be performed to define the gate electrodes 136 and 138 and the dielectric layers 132 and 134. In some embodiments, a planarization operation may be necessary to remove excessive materials of, or level the surface of, the gate electrodes 136 and 138.

In FIG. 1G, two source/drain regions 142 are formed in the well region 108. The source/drain regions 142 may be formed by ion implantation. The source/drain regions 142 are formed with the gate electrode 136 and the isolation structure 104 as implantation masks. In some embodiments, the source/drain regions 142 are of a dopant type, such as n-type, that is opposite to the dopant type of the well region 108. The source/drain regions 142 may be formed with their upper surface substantially level with the upper surface of the substrate 102. Alternatively, a raised source/drain structure may be also used. In some embodiments, the source/drain regions 142 have doping concentrations approximately equal to the doping concentration of the first doped region 112. In the present embodiments, the source/drain regions 142 in conjunction with the gate electrode 136 are configured as the n-type transistor 182. In some embodiments, a silicide layer (not separately shown) may be formed on each of the source/drain regions 142 to reduce the contact resistance between the source/drain regions 142 and overlying conductive structures.

Two additional two source/drain regions 144 similar to the source/drain regions 142, are formed in the substrate 102 on the sides of the gate electrode 138. The source/drain regions 144 may be of a dopant type, such as p-type, that is opposite to the dopant type of the substrate 102. In the present embodiments, the source/drain regions 144 in conjunction with the gate electrode 138 are configured as the p-type transistor 184. Additionally, a doped region 146 is formed in the well region 106 near an upper surface of the substrate 102. The doped region 146 may be of a dopant type that is the same as that of the well region 106. The doped region 146 may be doped with a higher doping concentration than the well region 106. In some embodiments, the doped region 146 includes a doping concentration similar to the doping concentration of the first doped region 112. In some embodiments, the doped region 146 is configured as an anode contact for the photodiode device 100.

Figure 1H:
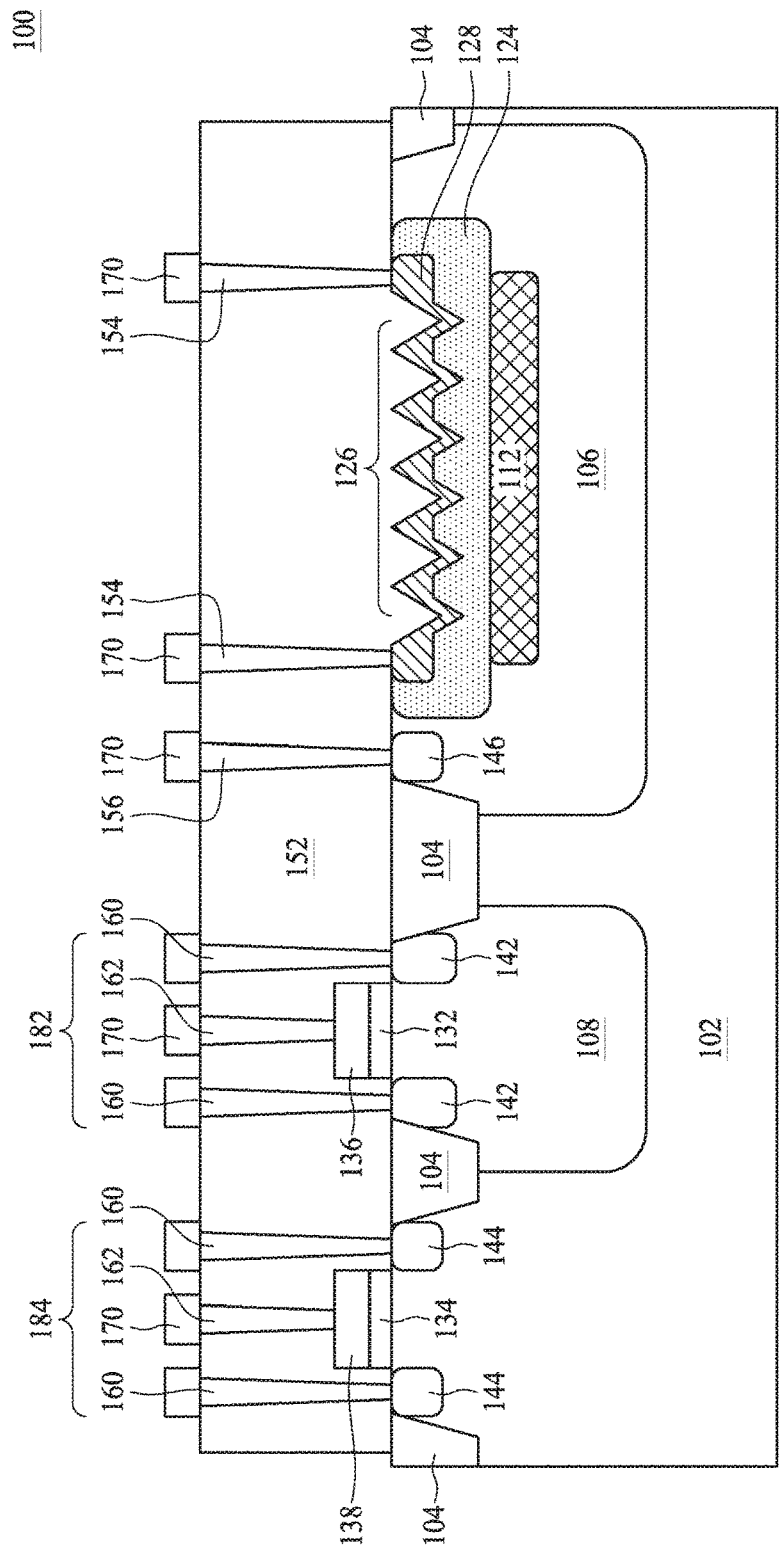

Referring to FIG. 1H, an inter-layer dielectric (ILD) 152 is formed over the substrate 102. In some embodiments, the ILD 152 also fills the recesses or trenches of the anti-reflection structure 126. The ILD 152 may be formed with a variety of dielectric materials and may be, for example, oxide (e.g., silicon oxide or Ge oxide), oxynitride (e.g., GaP oxynitride), silicon nitride, a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), a polymer material, or the like. The LLD 152 may formed by any suitable methods, such as CVD, PVD, spin coating, or the like.

Several conductive vias are formed in the ILD 152. One or more conductive vias 154 over the well region 106 electrically couples the third doped region 128 with a cathode terminal. Also, a conductive via 156 over the doped region 146 electrically couples the well region 106 with an anode terminal. Additionally, each of the source/drain regions 142 and 144 is electrically coupled to a corresponding conductive via 160. Furthermore, each of the gate electrodes 136 and 138 is electrically coupled to a corresponding conductive via 162. The conductive vias 154, 156, 160, and 162 may be formed by forming recesses through the ILD 152 by an etching operation. A conductive material may be filled into the recesses to electrically connect the underlying structures (e.g., doped regions 128, 142, 144 and 146). The conductive material of the conductive vias 154, 156, 160, and 162 may include, but is not limited to, titanium (Ti), tantalum (Ta), titanium nitride (TiN), tantalum nitride (TaN), copper (Cu), copper alloys, nickel (Ni), tin (Sn), gold (Au), or combinations thereof.

Once the conductive vias 154, 156, 160, and 162 are in place, several contact pads 170 are formed on the corresponding conductive vias 154, 156, 160, and 162. Each of the contact pads 170 may have a width larger than the conductive vias 154, 156, 160, and 162. In some embodiments, the contact pads 170 are disposed over the ILD 152. An exemplary operation for the formation of the contact pads 170 may include depositing a patterned layer over the ILD 152 to define the geometry of the contact pads. Next, conductive materials are formed over the patterned layer, and excessive portions of the conductive materials are then removed or etched.

Figure 1I:
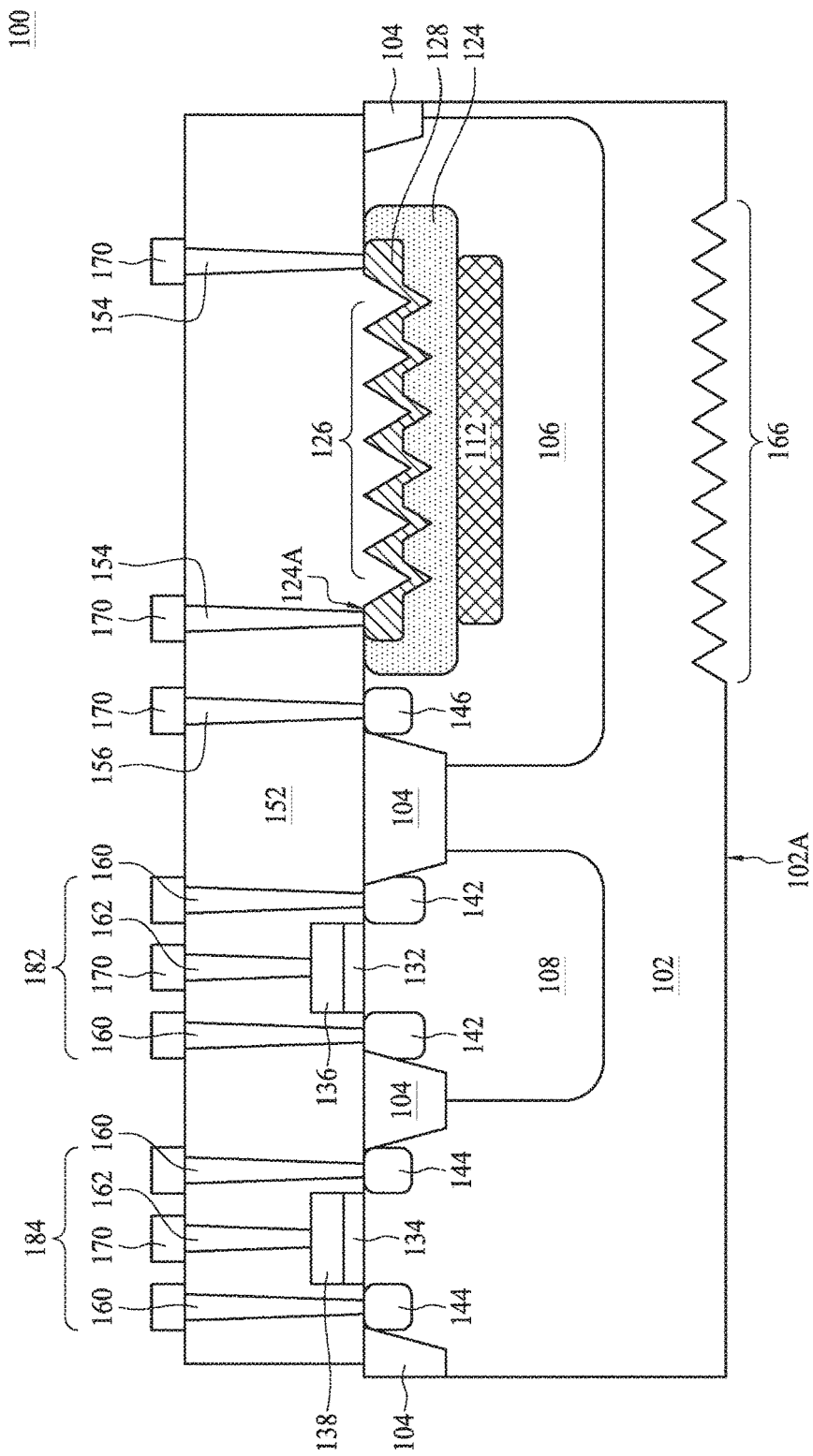

In some embodiments, additional anti-reflection structures may be also formed in the incident path of the light. As illustrated in FIG. 1I, another anti-reflection structure 166 is formed in the substrate 102. The anti-reflection structure 166 may be formed on a bottom surface 102A opposite the upper surface 124A of the substrate 102 (which is also regarded as the upper surface of the third region 128). In some embodiments, the anti-reflection structure 166 has a configuration and geometry similar to those of the anti-reflection structure 126. One difference between the two anti-reflection structures 126 and 166 may be their doping concentrations because the substrate 102 is usually formed of a lightly doped or un-doped semiconductor material. In some embodiments, the anti-reflection structure 166 may extend to the bottom surface 102A with a larger dimension than the anti-reflection structure 126 in order to filter more photons entering the well region 106 from different directions.

Figure 1J:
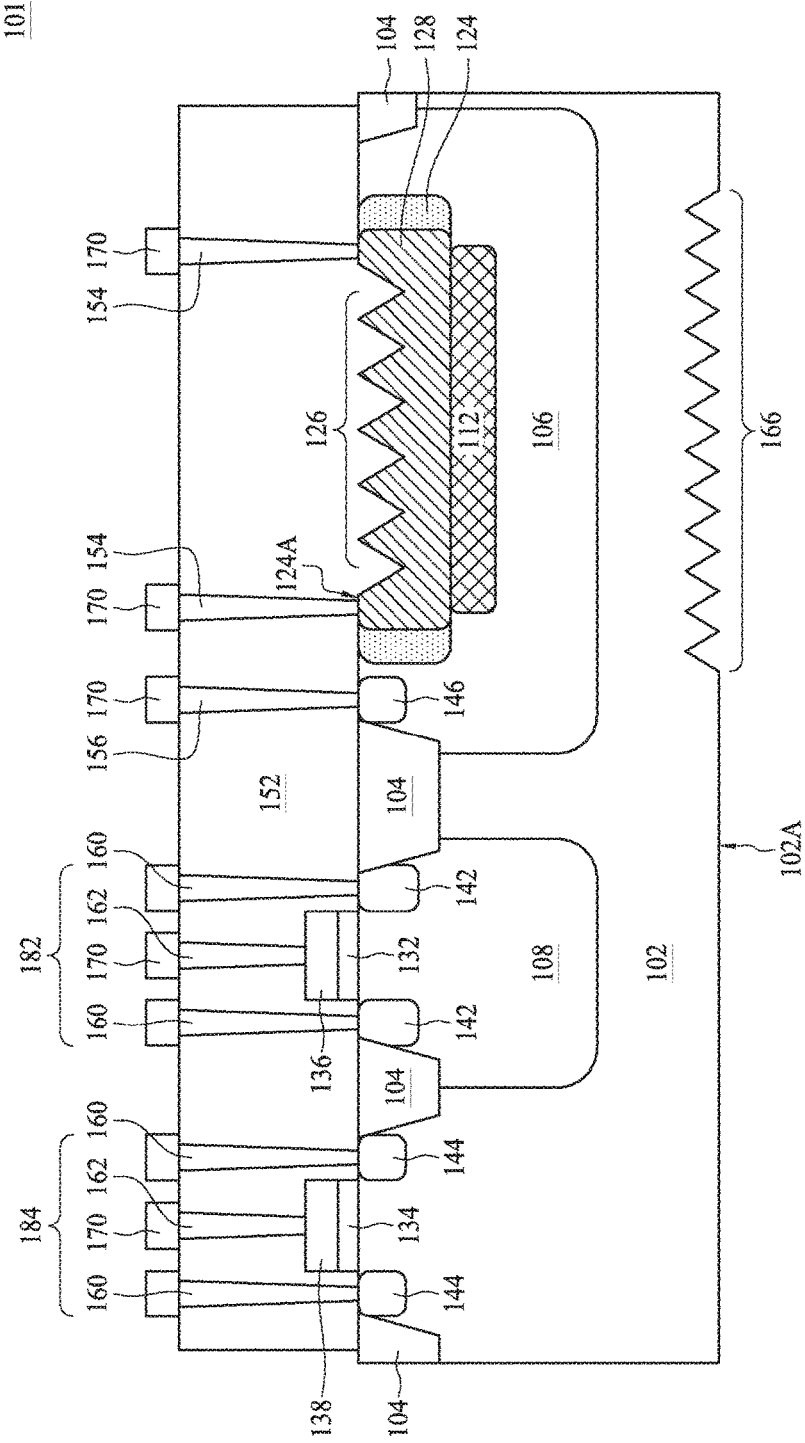
FIG. 1J is a schematic cross-section view of a photodiode device, accordance with some embodiments.

FIG. 1J is a schematic cross-sectional view of a photodiode device 101, in accordance with some embodiments. The photodiode device 101 is similar to the photodiode device 100 shown in FIG. 1I. However, the third doped region 128 in FIG. 1J is configured to extend farther downwards. In some embodiments, the third doped region 128 not only surrounds the anti-reflection structure 126 but also at least partially contacts the first doped region 112.

Figure 2:
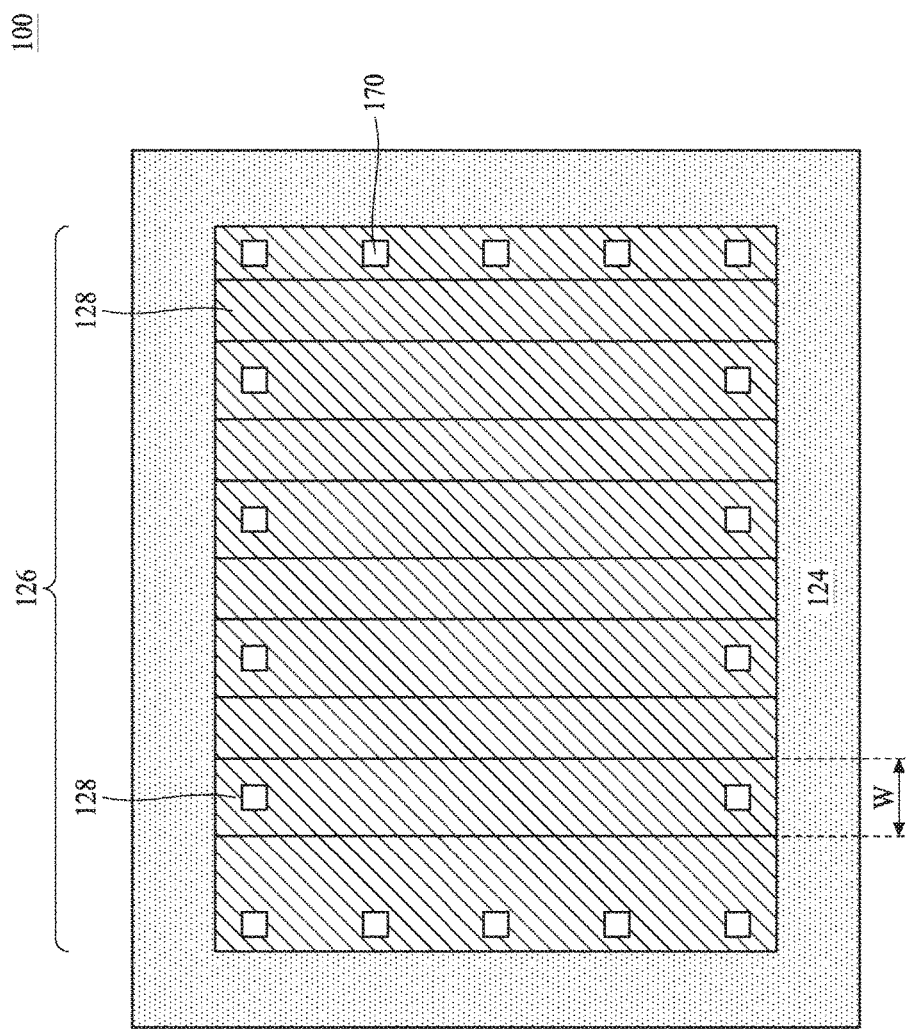
FIG. 2 is a schematic top view of a photodiode device, in accordance with some embodiments.

FIG. 2 is a schematic top view of the anti-reflection structure 126 of the photodiode device 100, in accordance with some embodiments. The anti-reflection structure 126 is disposed on the third doped region 128 and formed with parallel units, such as corrugations or recesses. The solid lines of the anti-reflection structure 126 represent vertices or boundaries, e.g., ridges or valleys, of the units, in some embodiments, each unit has a quadrilateral shape, rectangular shape, or a strip shape from a top view. In some embodiments, a width W of the strip for each unit is between about 1 µm and about 5 µm. In some embodiments, the width W is between about 500 nm and about 1000 nm. The contact pads 170 are disposed on the periphery of the third doped region 128. In some embodiments, the contact pads 170 are disposed at two ends of each unit of the isolation structure 226. In some embodiments, a central portion of the third doped region 128 is free from any overlying contact pad. A dense contact pad configuration may assist in draining free electrons in the third doped region 128. The dark current effect may be decreased accordingly.

FIGS. 3A through 3F are cross-sectional views of intermediate structures of a method of manufacturing a photodiode device 300, in accordance with some embodiments. As can be seen in the figures, the photodiode devices 100 and 300 share many aspects in common (e.g., some numerals are repeated between the two embodiments) and detailed descriptions thereof will be omitted for the sake of clarity and simplicity.

Figure 3A:
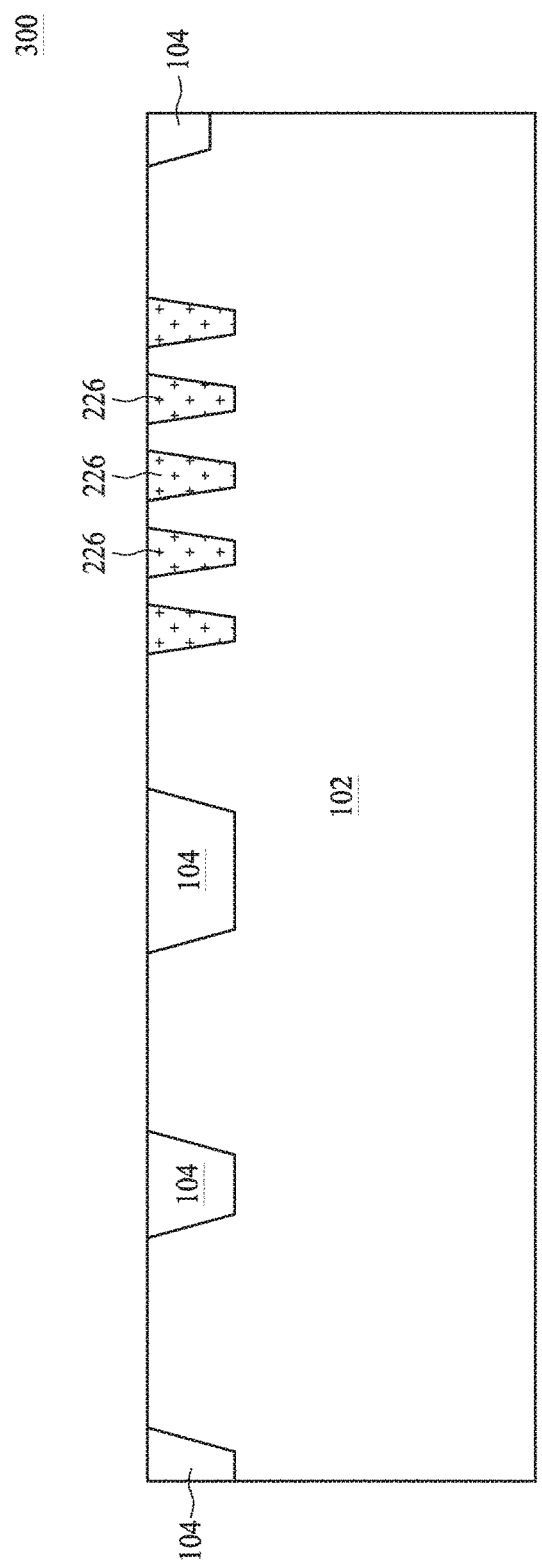
FIGS. 3A through 3F are cross-sectional views of intermediate structures of a method of manufacturing a photodiode device, in accordance with some embodiments.

Referring to FIG. 3A, several isolation structures 104 are formed in the substrate 102. In addition, several isolation structures 226 are also formed in the substrate 102. In some embodiments, the isolation structures 226 are formed of materials similar to the isolation structures 104. In some embodiments, the isolation structures 226 and 104 have substantially equal heights. In some embodiments, the isolation structures 226 have different shapes and sizes as compared to the isolation structures 104. As will be illustrated in following paragraphs, the isolation structures 226 are formed to occupy spaces of recesses for the anti-reflection structure 326. In some embodiments, the isolation structures 226 are spaced apart from one another with a spacing of between about 1 µm and about 5 µm. In some embodiments, the isolation structures 226 are spaced apart from one another with a spacing of less than about 1000 nm. In some embodiments, each of the isolation structures 226 has a width of less than about 1000 nm.

Figure 3B:
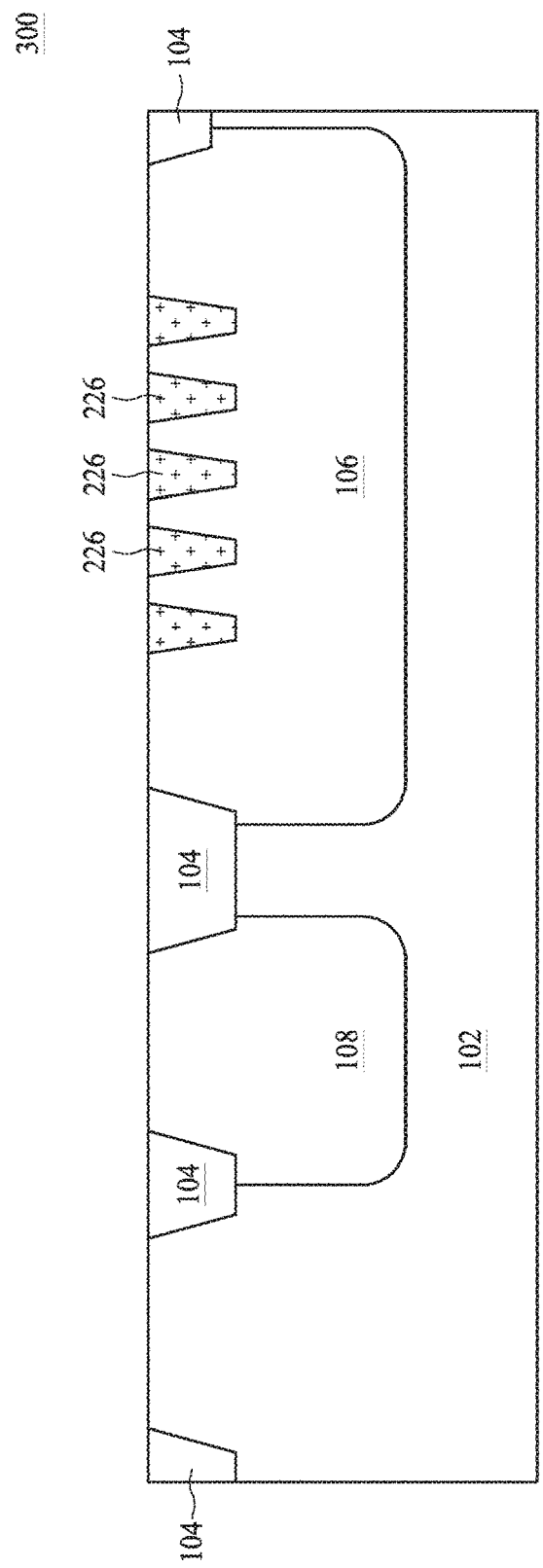
Figure 3C:
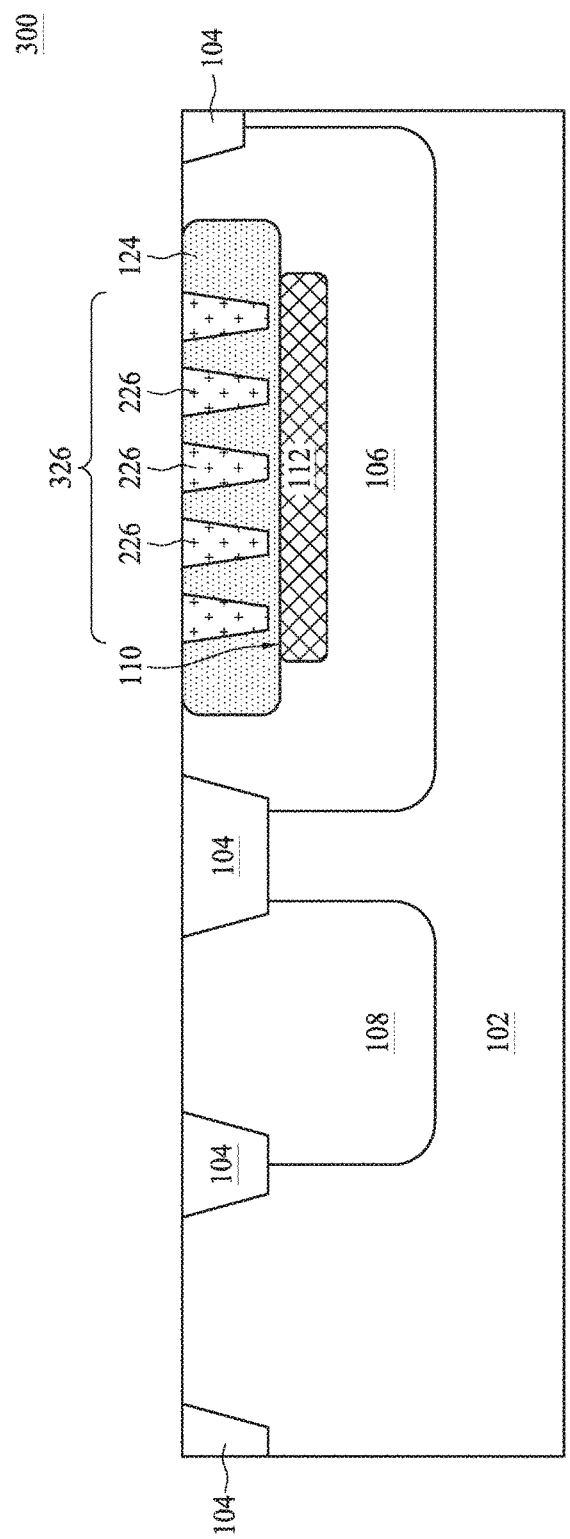

Next, well regions 106 and 108 are formed in the substrate 102 as illustrated in FIG. 3B. In some embodiments, the isolation structures 104 surround the well regions 106 and 108, while the isolation regions 226 are formed within the well region 106. As shown in FIG. 3C, a first doped region 112 and a second doped region 124 are sequentially formed in the well region 106. In some embodiments, the first doped region 112 and the second doped region 124 have depths greater than the isolation structures 226. In some embodiments, a PN junction 110 formed at the interface between the first doped region 112 and the second doped region 124 is situated below bottoms of the isolation structures 226. In some embodiments, the second doped region 124 separates the PN junction 110 from the isolation structures 226.

Figure 3D:
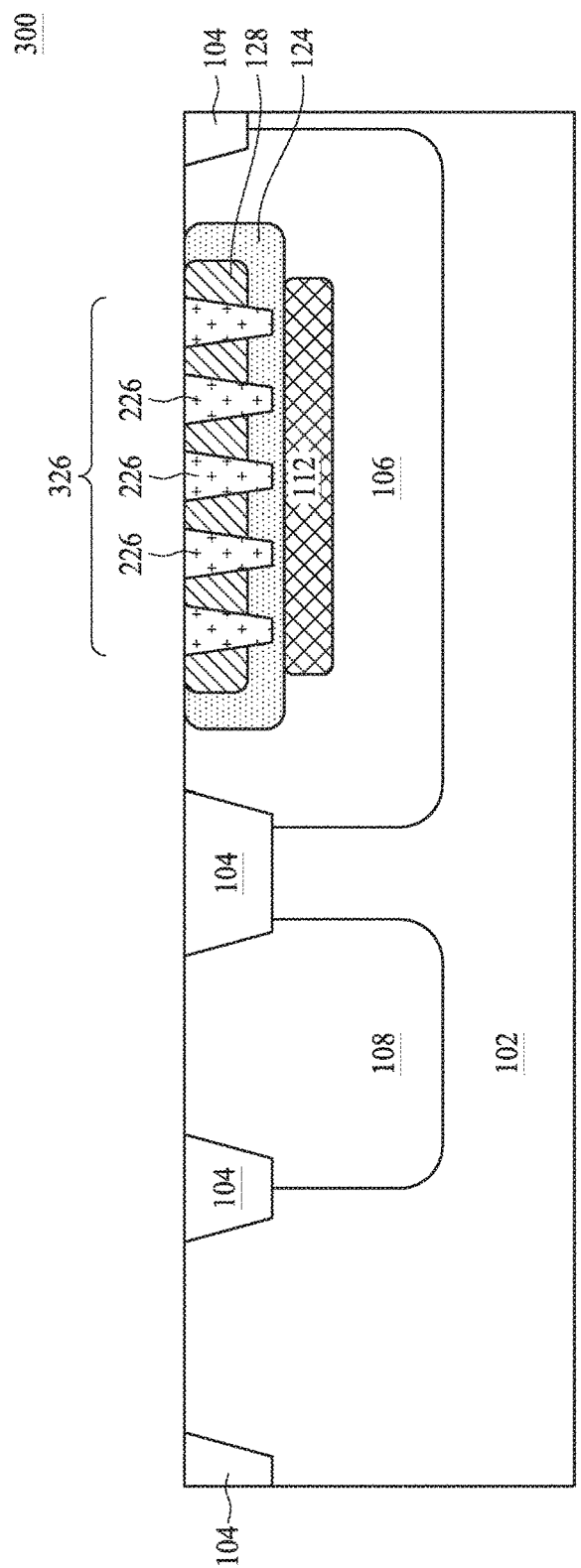

Next, referring to FIG. 3D, a third doped region 128 is formed in the second doped region 124. As can be seen in FIG. 3D, the isolation structures 226 serve as implantation masks in the forming operation of the third doped region 128. As a result, the third doped region 128 includes sidewalls interfacing with the isolation structures 226. Stated differently, the third doped region 128 includes units of anti-reflection structures 326 defined by the isolation structures 226.

In some embodiments, the third doped region 128 has a heavy doping concentration around an upper portion of the isolation structures 226. In some embodiments, the third doped region 128 has a substantially flat bottom. In some embodiments, a bottom portion of each of the isolation structures 226 is kept from the heavy dopants in forming the third doped region 128. In some embodiments, the isolation structures 226 are disposed closer to the PN junction 110 than the third doped region 128. That is, the distance between the isolation structures 226 and the PN junction 110 is less than the distance between the third doped region 128 and the PN junction 110. In some embodiments, the third doped region 128 is partitioned into sub-regions by the isolation structures 226. The isolation structures 226 may be regarded as recesses extending into the third doped region 128. In some embodiments, since the isolation structures 226 are formed in conjunction with the isolation structures 104 during a single operation, the isolation structures 226 (i.e., the recessed portions of the anti-reflection structure 326) have a height substantially equal to a height of the isolation structures 104.

Figure 3E:
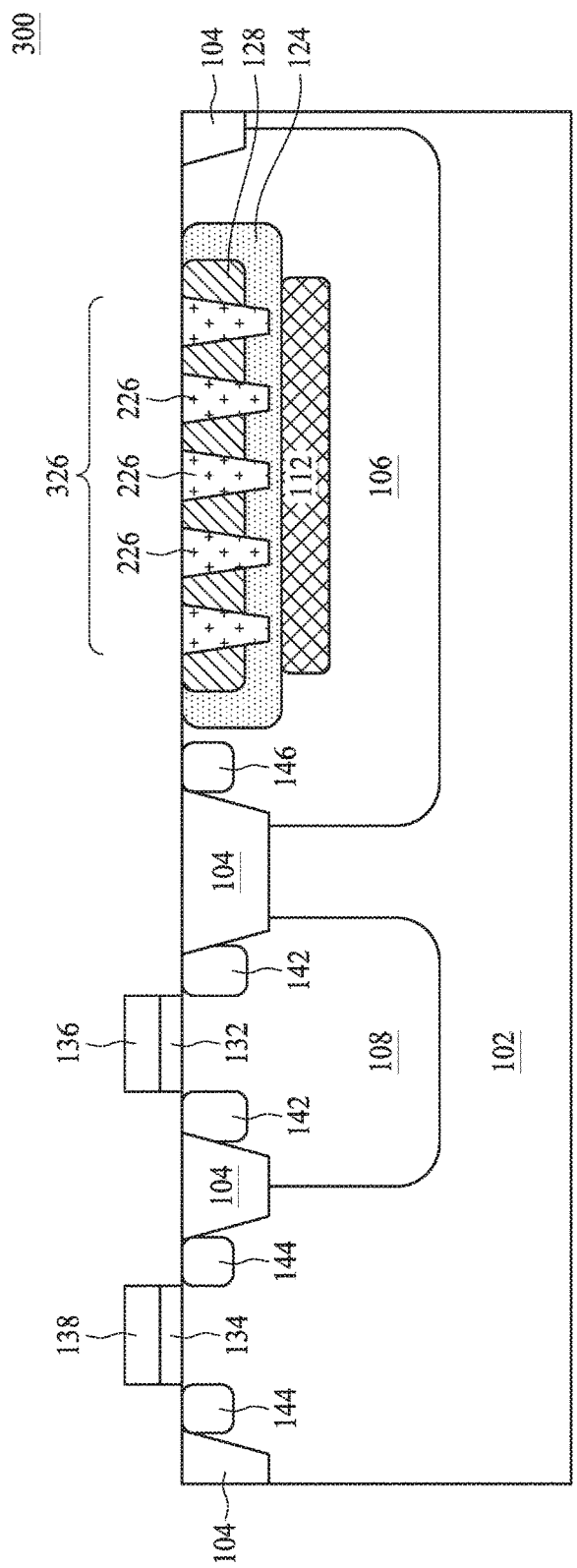
Figure 3F:
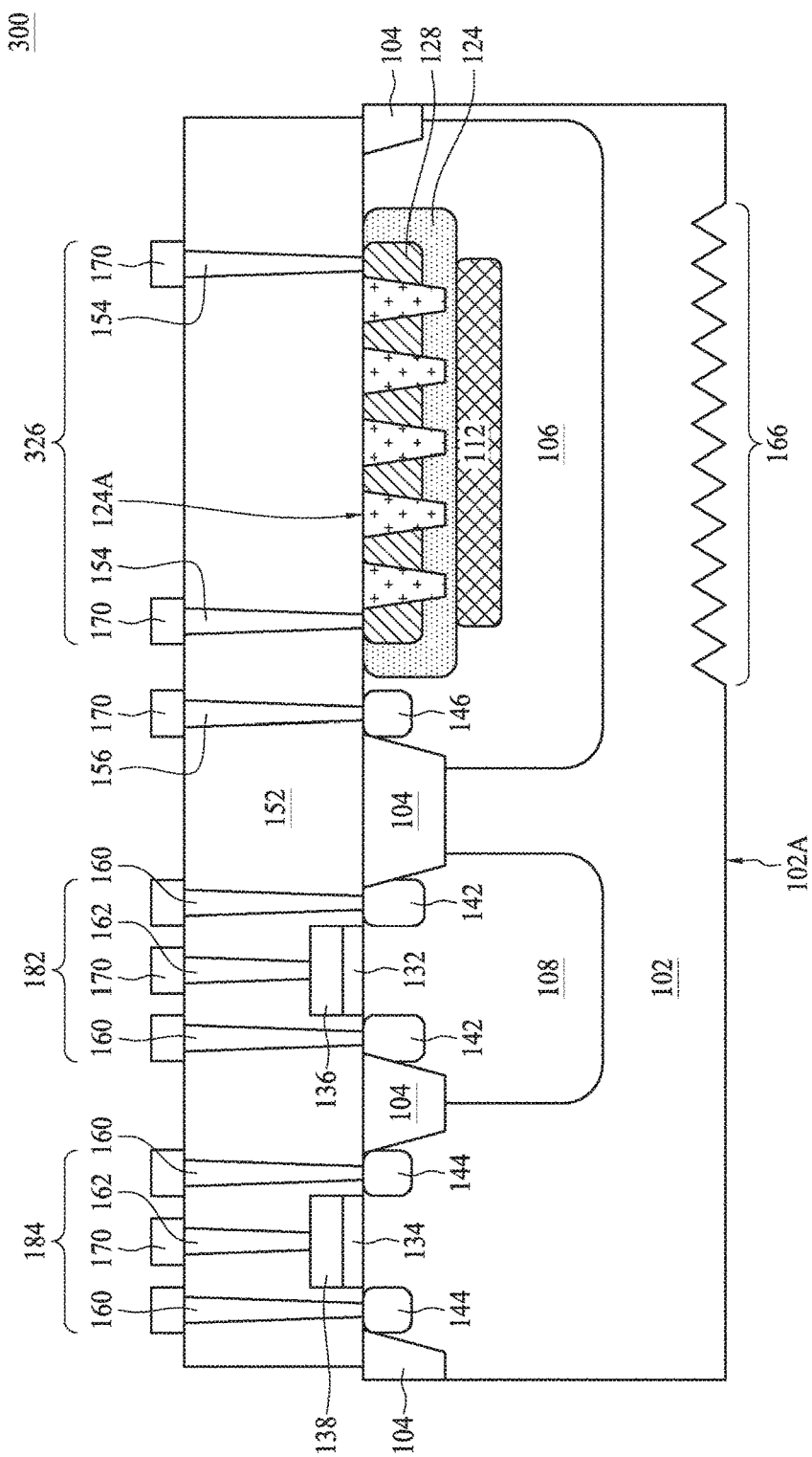

FIG. 3E illustrates the forming of dielectric layers 132 and 134, gate electrodes 136 and 138, source/drain regions 142 and 144, and the doped region 146. Subsequently, as illustrated in FIG. 3F, the ILD 152 and the conductive vias 154, 156, 160, and 162 are formed over the substrate 102. The materials and formation operations for the above-mentioned elements are similar to the descriptions provided above with reference to FIGS. 1F through 1H and are omitted herein. In some embodiments, an anti-reflection structure 166 is formed on the bottom surface 102A of the substrate 102. The anti-reflection structure 166 may be formed using an etching operation to cause recesses or trenches on the bottom surface 102A, e.g., in a sub-wavelength scale, in a manner similar to that described above with reference to FIG. 1D.

Figure 3G:
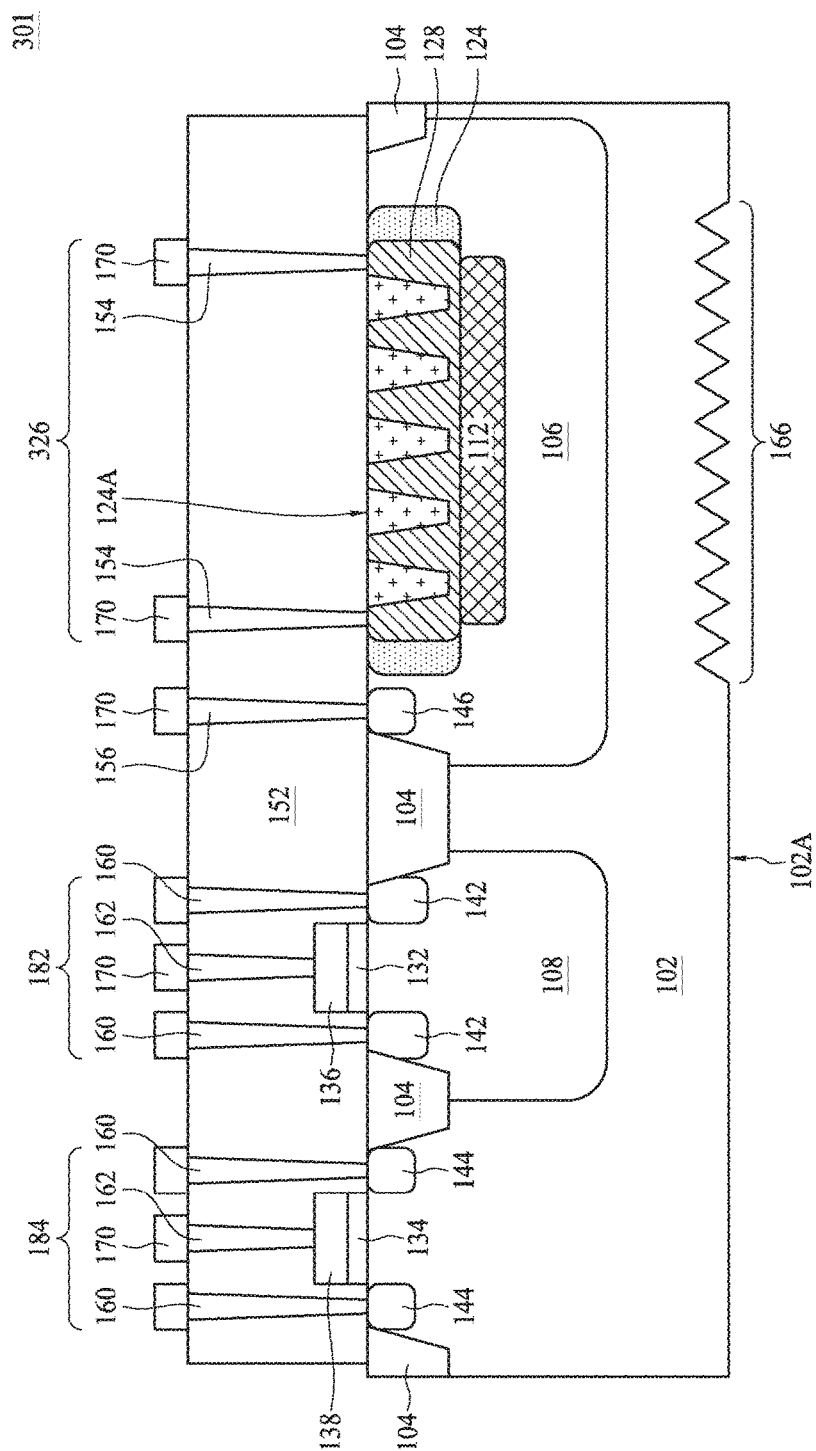
FIG. 3G is a schematic cross-sectional view of a photodiode device, in accordance with some embodiments.

FIG. 3G is a schematic cross-sectional view of a photodiode device 301, in accordance with some embodiments. The photodiode device 301 is similar to the photodiode device 300 shown in FIG. 3F. However, the third doped region 128 in FIG. 3G is configured to extend farther downwards. In some embodiments, the third doped region 128 not only surrounds the anti-reflection structure 326 but also at least partially contacts the first doped region 112.

Figure 4A:
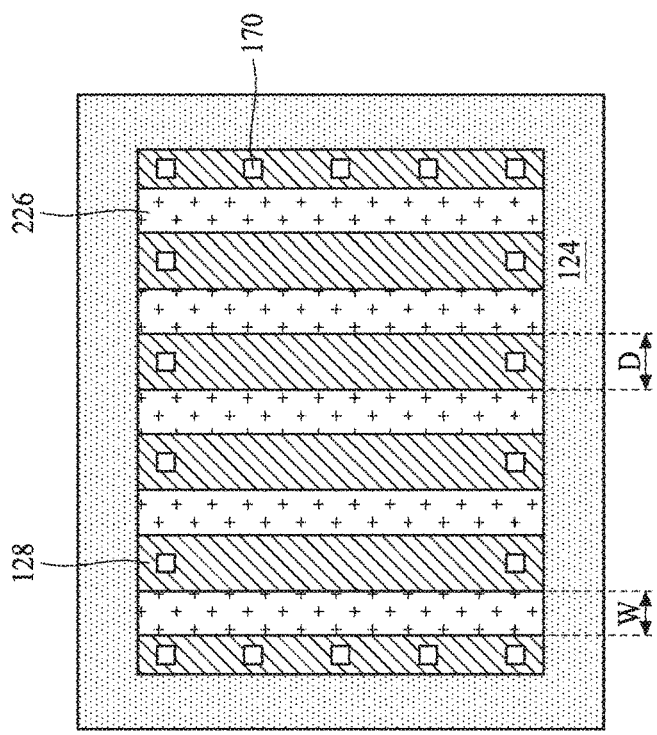
FIGS. 4A and 4B are schematic top views of a photodiode device, in accordance with some embodiments.
Figure 4B:
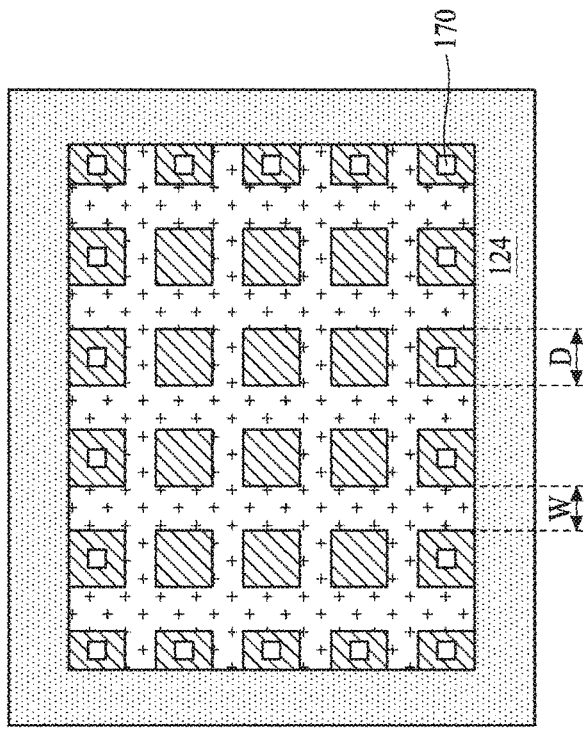

FIGS. 4A and 4B are schematic top views of the anti-reflection structure 326 of the photodiode device 300 of FIG. 3F and the photodiode device 301 of FIG. 3G, respectively, in accordance with some embodiments. Referring to FIG. 4A, the anti-reflection structure 326 is defined by the isolation structure 226 where each unit of the isolation structure 226 is arranged substantially in parallel with one another and spaced apart by the third doped region 128. In some embodiments, each unit of the isolation structure 226 has a quadrilateral shape, rectangular shape, or a strip shape from a top view. In some embodiments, a width W of the strip for each unit of the isolation structure 226 is between about 1 μm and about 5 μm. In some embodiments, the width W is between about 1 μm and about 2 μm. In some embodiments, the width W is between about 500 nm and about 1000 nm. In some embodiments, the third region 128 has several corrugations separated by the isolation structures 226. In some embodiments, each corrugation has a width D from a top view, where the width is between about 1 μm and about 5 μm. In some embodiments, the width D is between about 500 nm and about 1000 nm. In some embodiments, the width D is between about 1 μm and about 2 μm. The contact pads 170 are disposed on the periphery of the third doped region 128. In some embodiments, the contact pads 170 are disposed over each unit of the isolation structure 226 around the two ends thereof. In some embodiments, a central portion of the third doped region 128 is free from any overlying contact pad.

FIG. 4B shows another layout of the anti-reflection structure 326. The isolation structure 226 is formed of intersecting strips whereby the third doped region 128 is partitioned by the isolation structure 226 into a grid of sub-regions or pads from a top view. In some embodiments, each sub-region of the third region 128 may have a rectangular shape, a circular shape, a polygonal shape, or the like. In some embodiments, a width W of the strip of the isolation structure 226 is between about 1 μm and about 5 μm. In some embodiments, the width W is less than about 1000 nm. In some embodiments, the width W is between about 500 nm and about 1000 nm. In some embodiments, each sub-region or pad of the third region 128 has a width D from a top view, where the width is less than about 1000 nm. In some embodiments, the width D is between about 1 μm and about 5 μm. In some embodiments, the width D is between about 500 nm and about 1000 nm. In some embodiments, some sub-regions 128 on a periphery of the third doped region 128 are coupled to a corresponding contact pad 170. In some embodiments, some sub-regions 128 in a central area are free from any overlying contact pad.

Figure 5A:
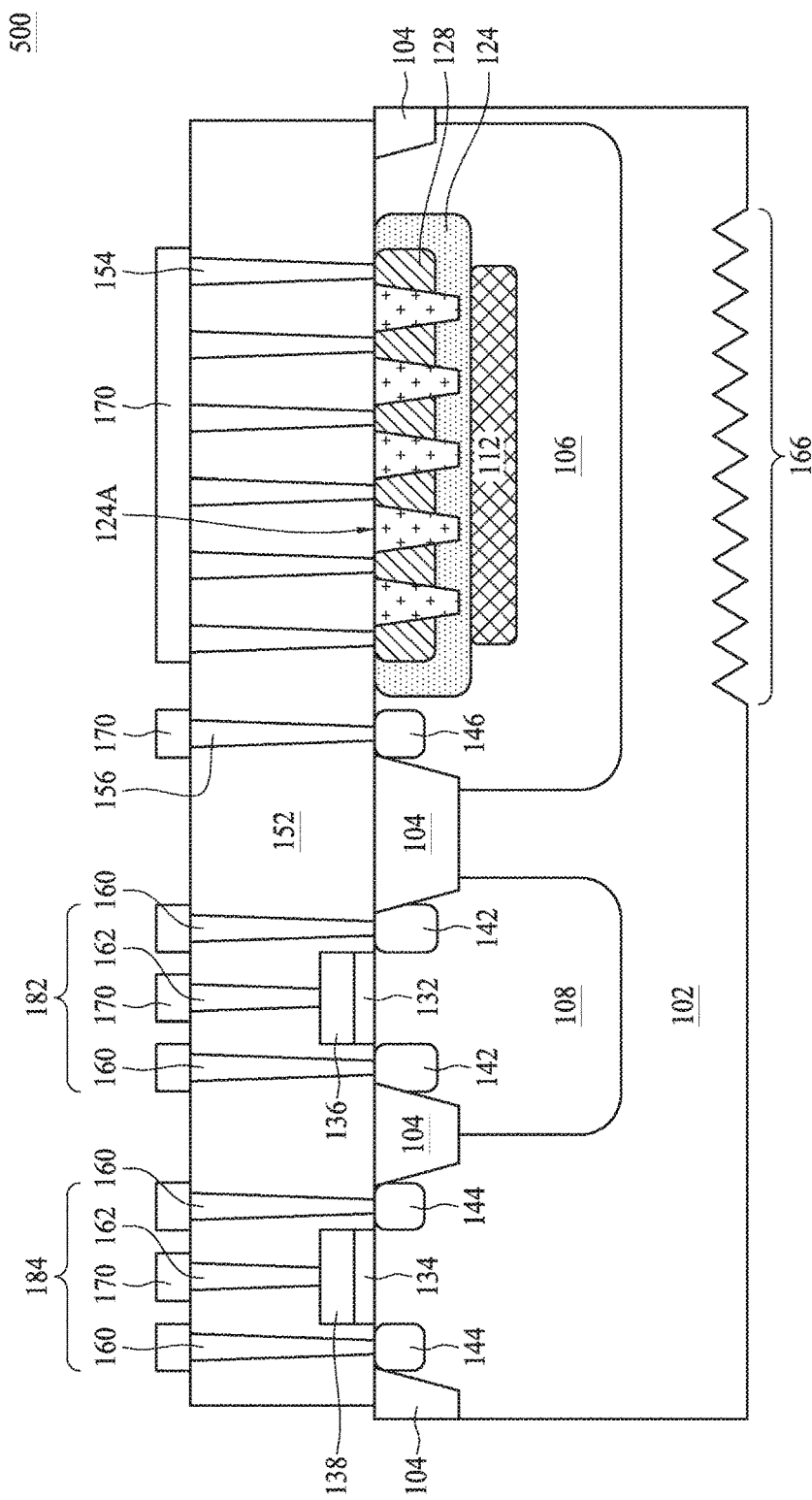
FIGS. 5A and 5B are schematic cross-sectional and top views of a photodiode device, in accordance with some embodiments.
Figure 5B:
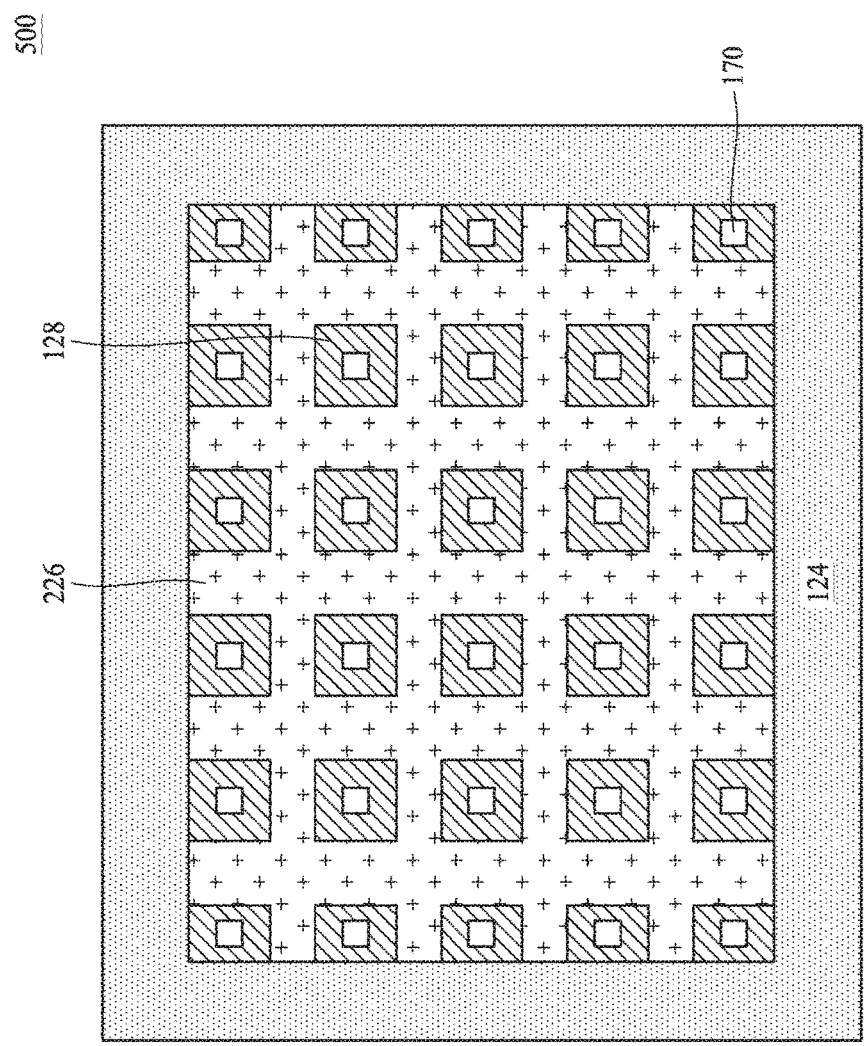

FIGS. 5A and 5B are schematic cross-sectional and top views of a photodiode device 500 in accordance with some embodiments. The photodiode device 500 is similar to the photodiode device 300 except for the configurations of the contact pads 170 for the cathode terminal. Referring to FIG. 5A, several contact vias 154 are coupled to the third doped regions 128 across the top surface 124A. The contact vias 154 are coupled and electrically connected to the third doped region 128 on both a periphery area and a central area. As can be seen more clearly in FIG. 5B, each of the contact vias 154 is coupled to and electrically connected to a corresponding sub-region of the third doped region 128. A dense contact pad configuration may assist in draining free electrons in the third doped region 128. The dark current effect may be decreased accordingly.

The present disclosure provides a photodiode device, which includes a semiconductor substrate, a well region in the semiconductor substrate of a first dopant type, a first doped region of the first dopant type in the well region, and a second doped region of a second dopant type disposed in the well region and over the first doped region. The second doped region comprises first recesses exposed through a surface of the second doped region, and a first portion of the second doped region on the surface comprises a first doping concentration of the second dopant type greater than a second doping concentration of a second portion of the second doped region away from the first recesses.

The present disclosure provides a photodiode device, which includes a semiconductor substrate of a first dopant type, a well region of a second dopant type disposed in the semiconductor substrate, a first doped region of the second dopant type disposed in the well region, a second doped region of the first dopant type disposed in the well region and over the first doped region, and a third doped region disposed of the first dopant type disposed in the second doped region. The third doped region comprises recesses. The third doped region also includes a doping concentration greater than a doping concentration of the second doped region and covers at least a top portion of each of the recesses.

The present disclosure provides a method of manufacturing photodiode device. A semiconductor substrate of a first dopant type is provided. A well region of a second dopant type is formed in the semiconductor substrate. A first doped region of the second dopant type is formed in the well region. A second doped region of the first dopant type is formed in the well region and over the first doped region. A plurality of recesses are formed on a surface of the second doped region. A third doped region of the first dopant type is formed in a top portion of the second doped region. A doping concentration of the top portion is greater than a doping concentration of the rest of the second doped region and the top portion at least partially surrounds the recesses. A dielectric layer is formed over the second doped region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photodiode device, comprising:
a semiconductor substrate;
a well region in the semiconductor substrate of a first dopant type;
a first doped region of the first dopant type in the well region;
a plurality of contact vias; and
a second doped region of a second dopant type disposed in the well region and over the first doped region, the second doped region comprising first recesses exposed through a surface of the second doped region,
wherein a first portion of the second doped region on the surface comprises a first doping concentration of the second dopant type greater than a second doping concentration of a second portion of the second doped region away from the first recesses, and
wherein the second doped region is partitioned into a grid of pads from a top view by the first recesses, the plurality of conductive vias being correspondingly coupled to each of the pads.

2. The photodiode device of claim 1, wherein the first portion of the second doped region covers an entirety of a sidewall of each of the first recesses.

3. The photodiode device of claim 1, wherein the first portion of the second doped region extends below a bottom of each of the first recesses.

4. The photodiode device of claim 1, further comprising a dielectric material filling the first recesses.

5. The photodiode device of claim 1, wherein the first doping concentration is between about 1E19 and about 2E20 atoms/cm$^3$.

6. The photodiode device of claim 1, further comprising a fourth doped region of the first dopant type in the well region, the fourth doped region being electrically coupled to an anode terminal.

7. The photodiode device of claim 1, wherein each of the first recesses further comprises a bottom surface in the second doped region.

8. The photodiode device of claim 1, further comprising a dielectric layer over the second doped region and surrounding the plurality of contact vias.

9. The photodiode device of claim 1, wherein the first recesses comprise staggered sidewalls meeting one another.

10. The photodiode device of claim 1, wherein the first portion contacts the first doped region.

11. The photodiode device of claim 1, further comprising second recesses on a surface of the semiconductor substrate opposite the second doped region.

12. A photodiode device, comprising:
a semiconductor substrate of a first dopant type;
a well region of a second dopant type disposed in the semiconductor substrate;
a first doped region of the second dopant type disposed in the well region;
a second doped region of the first dopant type disposed in the well region and over the first doped region;
a third doped region of the first dopant type disposed in the second doped region, the third doped region comprising recesses; and
a plurality of contact vias,
wherein the third doped region comprises a doping concentration greater than a doping concentration of the second doped region and covers at least a top portion of each of the recesses,
wherein the third doped region comprises a pattern of an array of pads from a top view separated by the recesses, and the plurality of contact vias are correspondingly coupled to each of the pads.

13. The photodiode device of claim 12, further comprising an isolation structure surrounding the well region, the recesses having a depth substantially equal to a depth of the isolation structure.

14. The photodiode device of claim 13, wherein the recesses are filled with a material that is the same as a material of the isolation structure.

15. The photodiode device of claim 12, wherein the second doped region separates the recesses and the third doped region from the first doped region.

16. The photodiode device of claim 12, further comprising a dielectric layer over the second doped region and the third doped region, the dielectric layer filling the recesses.

17. A photodiode device, comprising:
a well region of a first dopant type;
a first doped region of the first dopant type disposed in the well region;
a plurality of contact vias; and
a second doped region of a second dopant type disposed over the first doped region, a surface of the second doped region comprising anti-reflection structures,
wherein the second doped region comprises a first portion including the anti-reflection structures and having a first doping concentration greater than a second doping concentration of a second portion of the second doped region adjacent to the first doped region, and
wherein the second doped region comprises a pattern of an array of pads from a top view separated by the anti-reflection structures, the plurality of conductive vias being correspondingly coupled to each of the pads.

18. The photodiode device according to claim 17, wherein the first doping concentration is greater than a third doping concentration of a third portion of the second doped region adjacent to the well region.

19. The photodiode device according to claim 17, further comprising an inter-layer dielectric covering the anti-reflection structures and the well region.

20. The photodiode device according to claim 19, further comprising a conductive via extending through the inter-layer dielectric and contacting the first portion of the second doped region.

* * * * *